(12) United States Patent
Yang et al.

(10) Patent No.: US 6,847,111 B2
(45) Date of Patent: Jan. 25, 2005

(54) SEMICONDUCTOR DEVICE WITH HEAT-DISSIPATING CAPABILITY

(75) Inventors: Chia-Ming Yang, Tainan (TW); Shu-Fen Liang, Kaohsiung (TW); Shu-Min Chou, Tainan Hsien (TW)

(73) Assignee: Orient Semiconductor Electronics, Ltd., Kaohsiung (TW)

( * ) Notice: Subject to any disclaimer, the term of this patent is extended or adjusted under 35 U.S.C. 154(b) by 0 days.

(21) Appl. No.: 10/683,911

(22) Filed: Oct. 10, 2003

(65) Prior Publication Data

US 2004/0075166 A1 Apr. 22, 2004

Related U.S. Application Data

(63) Continuation-in-part of application No. 10/196,940, filed on Jul. 18, 2002, now abandoned.

(51) Int. Cl.[7] ........................... H01L 23/10; H01L 23/34
(52) U.S. Cl. ....................................... 257/707; 257/706
(58) Field of Search ................................ 257/706, 707, 257/711, 720, 784, 698, 787

(56) References Cited

U.S. PATENT DOCUMENTS

| | | | | |
|---|---|---|---|---|
| 4,938,280 A | | 7/1990 | Clark ........................ 165/80.4 |
| 5,796,165 A | | 8/1998 | Yoshikawa et al. ......... 257/728 |
| 5,856,911 A | | 1/1999 | Riley ......................... 361/704 |
| 5,989,941 A | | 11/1999 | Wensel ....................... 438/127 |
| 6,011,694 A | * | 1/2000 | Hirakawa .................... 361/774 |
| 6,046,499 A | | 4/2000 | Yano et al. ................. 257/712 |
| 6,219,238 B1 | | 4/2001 | Andros et al. .............. 361/704 |
| 6,359,341 B1 | | 3/2002 | Huang et al. ............... 257/778 |
| 6,552,428 B1 | * | 4/2003 | Huang et al. ............... 257/706 |
| 6,657,296 B2 | * | 12/2003 | Ho et al. .................... 257/720 |
| 6,753,600 B1 | * | 6/2004 | Ho ............................. 257/698 |
| 2003/0160320 A1 | | 8/2003 | Shieh et al. ................ 257/712 |
| 2004/0119158 A1 | * | 6/2004 | Tatt et al. ................... 257/707 |

* cited by examiner

*Primary Examiner*—S. V. Clark
(74) *Attorney, Agent, or Firm*—Winston Hsu

(57) ABSTRACT

In a semiconductor device, a semiconductor chip is mounted on an inner seat body of a heat-dissipating frame mounted on a top surface of a dielectric substrate. Each of multiple bonding wires interconnects electrically one of multiple contact pads on the semiconductor chip and a corresponding one of multiple first conductive contacts on the top surface of the substrate so as to establish electrical connection between the contact pads on the semiconductor chip and multiple second conductive contacts on a bottom surface of the substrate via the first conductive contacts and circuit traces of the substrate. An encapsulant encapsulates the bonding wires, the semiconductor chip, and the inner seat body, a portion of an outer frame body of the heat-dissipating frame, and multiple that interconnect portions interconnecting heat-conductively the inner seat body and the outer frame body.

5 Claims, 4 Drawing Sheets

US 6,847,111 B2

SEMICONDUCTOR DEVICE WITH HEAT-DISSIPATING CAPABILITY

CROSS-REFERENCE TO RELATED APPLICATION

This application is a continuation-in-part (CIP) of U.S. patent application Ser. No. 10/196,940, entitled "A HIGH HEAT DISSIPATION MICRO-PACKAGING BODY FOR SEMICONDUCTOR CHIP", filed on Jul. 18, 2002, now abandoned.

BACKGROUND OF THE INVENTION

1. Field of the Invention

The invention relates to a semiconductor device, more particularly to a semiconductor device with a heat-dissipating capability.

2. Description of the Related Art

FIG. 1 illustrates a conventional semiconductor device 1 that includes a dielectric substrate 11, a semiconductor chip 12 adhered on the dielectric substrate 11, a plurality of bonding wires 13 interconnecting electrically circuit traces on the dielectric substrate 11 and the semiconductor chip 12, a plurality of tin balls 16 mounted on a bottom surface of the dielectric substrate 11, a heat-dissipating cover plate 14 covering the semiconductor chip 12 and the bonding wires 13, and a sealing resin 15 sealing a portion of the heat-dissipating cover plate 14 and a portion of the dielectric substrate 11. In the aforesaid conventional semiconductor device 1, the heat-dissipating cover plate 14 does not contact the semiconductor chip 12 directly such that heat generated by the semiconductor chip 12 cannot be effectively dissipated.

FIG. 2 illustrates another conventional semiconductor device 2 disclosed in U.S. Pat. No. 5,856,911. In the conventional semiconductor device 2, a dielectric substrate 21 is formed with a through hole. A heat-dissipating plate 22 is mounted on a bottom surface of the dielectric substrate 21. A semiconductor chip 23 is disposed in the through hole in the dielectric substrate 21, and is mounted on and is in thermal communication with the heat-dissipating plate 22. As such, heat generated by the semiconductor chip 23 can be dissipated by the heat-dissipating plate 22 and a heat sink 27 connected heat-conductively to the heat-dissipating plate 22. However, the number and arrangements of input/output terminals on the dielectric substrate 21 are limited by the size of the heat-dissipating plate 22. Furthermore, due to the presence of the heat sink 27, a circuit board 100 to be applied with the conventional semiconductor device 2 is required to be formed with a through hole for extension of the heat sink 27 therethrough.

FIG. 3 illustrates a further conventional semiconductor device 3 disclosed in U.S. Pat. No. 5,989,941. In the conventional semiconductor device 3, heat generated by a semiconductor chip 34 mounted on a dielectric substrate 31 is merely conducted to a metallized circuit pattern 33 mounted on the dielectric substrate 31 via a plurality of bonding wires 35 such that the conventional semiconductor device 3 cannot achieve effective heat-dissipation.

FIG. 4 illustrates still another conventional semiconductor device 4 disclosed in U.S. Pat. No. 6,219,238B1. In the conventional semiconductor device 4, a heat-dissipating plate 42 is mounted on a top surface of a dielectric substrate 41. A semiconductor chip 43 is disposed in a through hole in the dielectric substrate 41 and is mounted on the heat-dissipating plate 42. A plurality of bonding wires 44 interconnect electrically the semiconductor chip 43 and a plurality of conductive contacts (not shown) on a bottom surface of the dielectric substrate 41. As such, heat generated by the semiconductor chip 43 can be dissipated by the heat-dissipating plate 42. However, the number of input/output terminals, which can actually be formed on the bottom surface of the dielectric substrate 41, is limited.

SUMMARY OF THE INVENTION

Therefore, the object of the present invention is to provide a semiconductor device that can provide higher heat-dissipating efficiency as compared to the prior art.

According to the present invention, a semiconductor device comprises:

a dielectric substrate having opposite top and bottom surfaces and formed with a plurality of circuit traces, the top surface being formed with a plurality of first conductive contacts, each of which is connected electrically to a corresponding one of the circuit traces, the bottom surface being formed with a plurality of second conductive contacts, each of which is connected electrically to a corresponding one of the circuit traces;

a heat-dissipating frame including an inner seat body mounted on the top surface of the dielectric substrate, an outer frame body mounted on the top surface of the dielectric substrate and surrounding and spaced apart from the inner seat body, and a plurality of interconnecting portions, each of which interconnects heat-conductively the inner seat body and the outer frame body, the dielectric substrate cooperating with the inner seat body and the outer frame body so as to confine a surrounding groove, the first conductive contacts being disposed in the surrounding groove;

a semiconductor chip mounted on and in thermal communication with the inner seat body, the semiconductor chip being provided with a plurality of contact pads thereon;

a plurality of bonding wires, each of which has one end connected electrically to one of the contact pads on the semiconductor chip, and the other end extending into the surrounding groove and connected electrically to a corresponding one of the first conductive contacts on the top surface of the dielectric substrate so as to establish electrical connection between the contact pads on the semiconductor chip and the second conductive contacts on the bottom surface of the dielectric substrate via the first conductive contacts and the circuit traces; and an encapsulant which encapsulates the bonding wires, the semiconductor chip, and the inner seat body, the interconnecting portions and a portion of the outer frame body of the heat-dissipating frame.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
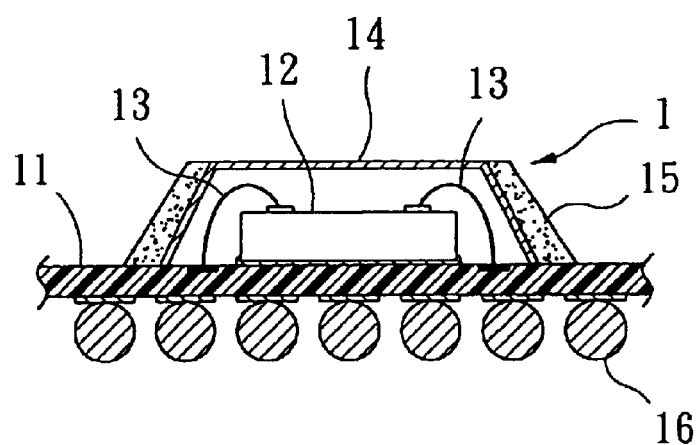
FIG. 1 is a schematic sectional view of a conventional semiconductor device.
Figure 2:
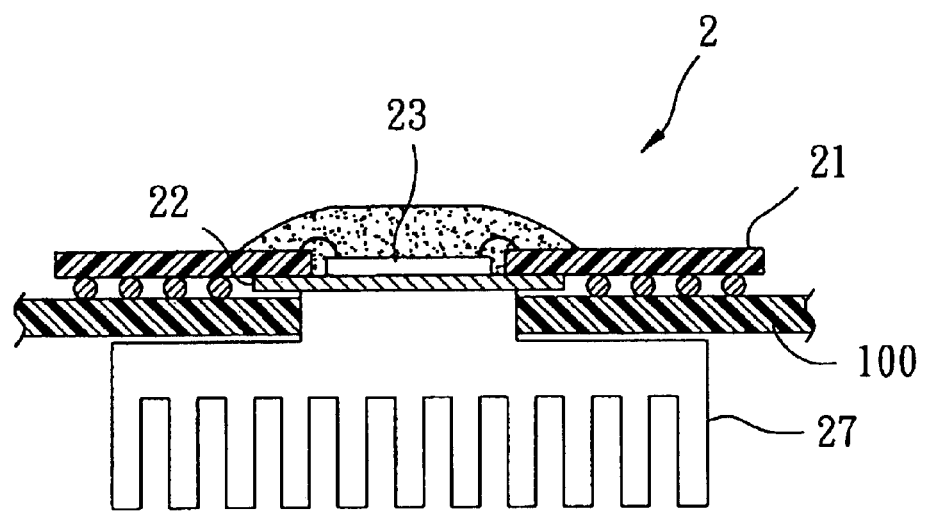
FIG. 2 is a schematic sectional view of another conventional semiconductor device.
Figure 3:
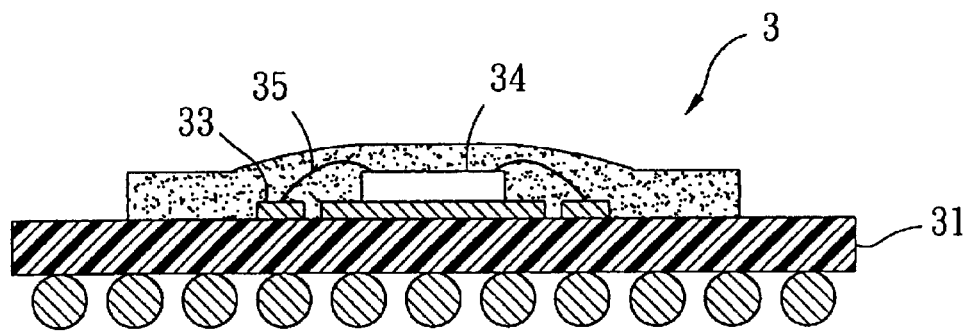
FIG. 3 is a schematic sectional view of a further conventional semiconductor device.
Figure 4:
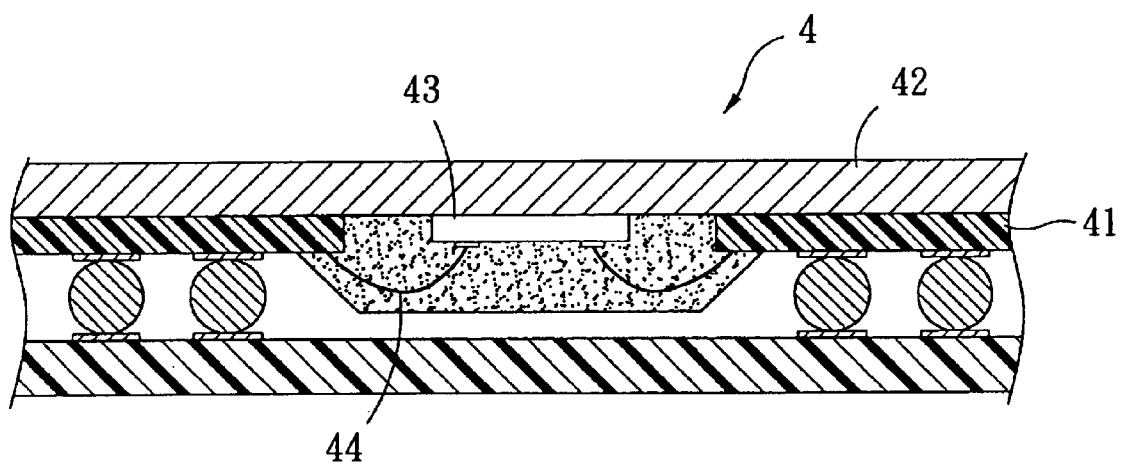
FIG. 4 is a schematic sectional view of still another conventional semiconductor device.
Figure 5:
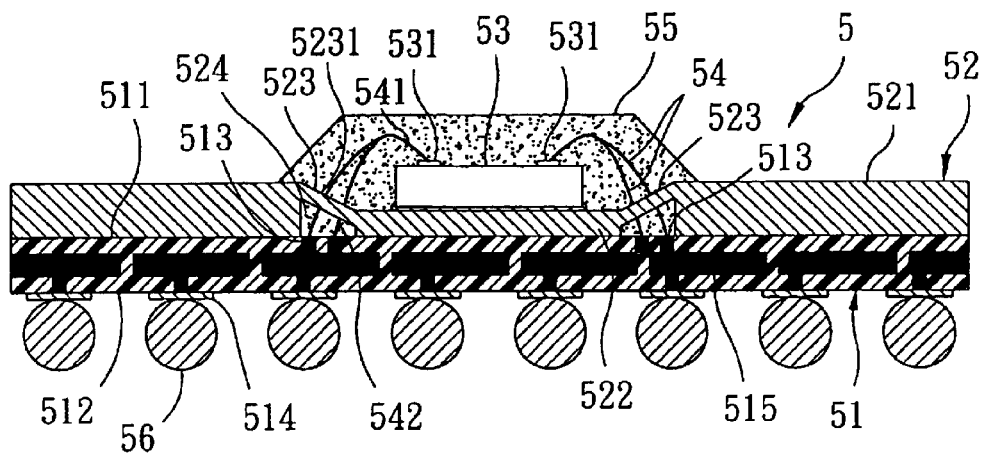
FIG. 5 is a schematic sectional view showing the preferred embodiment of a semiconductor device according to the present invention.
Figure 6:
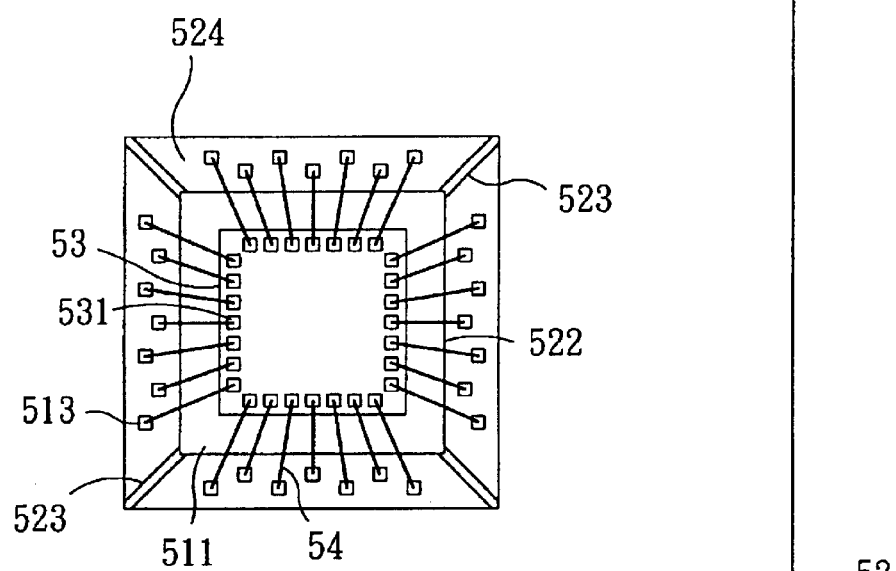
FIG. 6 is a schematic top view showing the preferred embodiment.
Figure 7:
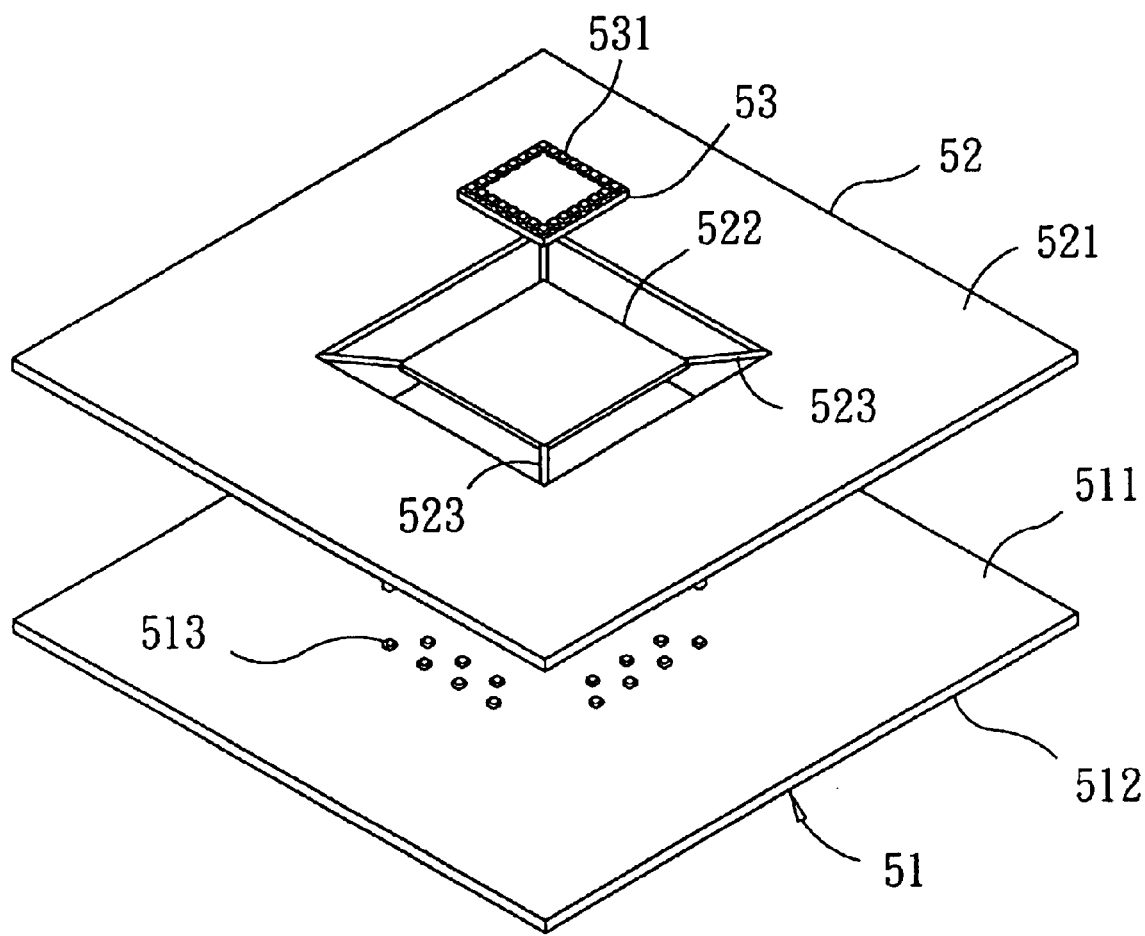
FIG. 7 is an exploded perspective view showing the preferred embodiment.

Referring to FIGS. 5 to 7, the preferred embodiment of a semiconductor device 5, such as a ball grid array package, according to the present invention is shown to include a dielectric substrate 51, a heat-dissipating frame 52, a semiconductor chip 53, a plurality of bonding wires 54, and an encapsulant 55.

The dielectric substrate 51 has opposite top and bottom surface 511, 512, and is formed with a plurality of circuit traces 515. The top surface 511 is formed with a plurality of first conductive contacts 513, each of which is connected electrically to a corresponding one of the circuit traces 515 (see FIG. 5). The bottom surface 512 is formed with a plurality of second conductive contacts 514, each of which is connected electrically to a corresponding one of the circuit traces 515. The second conductive contacts 514 are adapted to be connected electrically to a circuit board (not shown) via a plurality of tin balls 56 mounted respectively thereon.

The heat-dissipating frame 52 includes an inner seat body 522 mounted on the top surface 511 of the dielectric substrate 51, an outer frame body 521 mounted on the top surface 511 of the dielectric substrate 51 and surrounding and spaced apart from the inner seat body 522, and a plurality of interconnecting portions 523, S each of which interconnects heat-conductively the inner seat body 522 and the outer frame body 521. The dielectric substrate 51 cooperates with the inner seat body 522 and the outer frame body 521 so as to confine a surrounding groove 524, as best shown in FIG. 5. The first conductive contacts 513 are disposed in the surrounding groove 524. In this embodiment, the heat-dissipating frame 52 is made of a material selected from the group consisting of copper and copper alloy. The inner seat body 522 has a thickness less than that of the outer frame body 521, and is rectangular. The interconnecting portions 523 extend upwardly and inclinedly from corners of the inner seat body 522, as shown in FIGS. 5 and 6. Each interconnecting portion 523 is formed with a silver plating or a gold plating for enhancing heat conductivity.

The semiconductor chip 53 is mounted on and is in thermal communication with the inner seat body 522. The semiconductor chip 53 is provided with a plurality of contact pads 531 thereon.

Each bonding wire 54 has one end 541 connected electrically to one of the contact pads 531 on the semiconductor chip 53, and the other end 542 extending into the surrounding groove 524 and connected electrically to a corresponding one of the first conductive contacts 513 on the top surface 511 of the dielectric substrate 51 so as to establish electrical connection between the contact pads 531 on the semiconductor chip 53 and the second conductive contacts 514 on the bottom surface 512 of the dielectric substrate 51 via the first conductive contacts 513 and the circuit traces 515.

The encapsulant 55 encapsulates the bonding wires 54, the semiconductor chip 53, and the inner seat body 522, the interconnecting portions 523 and a portion of the outer frame body 521 of the heat-dissipating frame 52.

In view of the configuration of the heat-dissipating frame 52, heat generated by the semiconductor chip 53 can be rapidly and effectively conducted to the outer frame body 521 via the inner seat body 522 and the interconnecting portions 523, and is then dissipated. Furthermore, since the outer frame body 521 is mounted on the top surface 511 of the dielectric substrate 51 and since the surrounding groove 524 permits extension of the bonding wires 54 therethrough, the number and locations of the second conductive contacts 514 on the bottom surface 512 of the dielectric substrate 51 are not restricted.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A semiconductor device comprising:

a dielectric substrate having opposite top and bottom surfaces and formed with a plurality of circuit traces, said top surface being formed with a plurality of first conductive contacts, each of which is connected electrically to a corresponding one of said circuit traces, said bottom surface being formed with a plurality of second conductive contacts, each of which is connected electrically to a corresponding one of said circuit traces;

a heat-dissipating frame including an inner seat body mounted on said top surface of said dielectric substrate, an outer frame body mounted on said top surface of said dielectric substrate and surrounding and spaced apart from said inner seat body, and a plurality of interconnecting portions, each of which interconnects heat-conductively said inner seat body and said outer frame body, said dielectric substrate cooperating with said inner seat body and said outer frame body so as to confine a surrounding groove, said first conductive contacts being disposed in said surrounding groove;

a semiconductor chip mounted on and in thermal communication with said inner seat body, said semiconductor chip being provided with a plurality of contact pads thereon;

a plurality of bonding wires, each of which has one end connected electrically to one of said contact pads on said semiconductor chip, and the other end extending into said surrounding groove and connected electrically to a corresponding one of said first conductive contacts on said top surface of said dielectric substrate so as to establish electrical connection between said contact pads on said semiconductor chip and said second conductive contacts on said bottom surface of said dielectric substrate via said first conductive contacts and said circuit traces; and an encapsulant which encapsulates said bonding wires, said semiconductor chip, and said inner seat body, said interconnecting portions and a portion of said outer frame body of said heat-dissipating frame.

2. The semiconductor device as claimed in claim 1, wherein said heat-dissipating frame is made of a material selected from the group consisting of copper and copper alloy.

3. The semiconductor device as claimed in claim 1, wherein each of said interconnecting portions of said heat-dissipating frame is formed with one of a silver plating and a gold plating.

4. The semiconductor device as claimed in claim 1, wherein said inner seat body has a thickness less than that of said outer frame body.

5. The semiconductor device as claimed in claim 4, wherein said inner seat body is rectangular and said interconnecting portions extend upwardly and inclinedly from corners of said inner seat body.

* * * * *